(12) United States Patent
Hamlyn (10) Patent No.: US 10,013,009 B2
(45) Date of Patent: Jul. 3, 2018

(54) FAULT TOLERANT VOLTAGE REGULATOR

(71) Applicant: TEXAS INSTRUMENTS INCORPORATED, Dallas, TX (US)

(72) Inventor: Mark Bryan Hamlyn, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

(21) Appl. No.: 15/275,033

(22) Filed: Sep. 23, 2016

(65) Prior Publication Data

US 2017/0090497 A1    Mar. 30, 2017

Related U.S. Application Data

(60) Provisional application No. 62/233,136, filed on Sep. 25, 2015.

(51) Int. Cl.
| | |
|---|---|
| G05F 1/575 | (2006.01) |
| G05F 1/56 | (2006.01) |
| H03K 5/00 | (2006.01) |
| H02M 1/36 | (2007.01) |
| H02M 1/32 | (2007.01) |
| H03F 3/45 | (2006.01) |
| H03F 1/52 | (2006.01) |

(52) U.S. Cl.
CPC ............. *G05F 1/575* (2013.01); *G05F 1/56* (2013.01); *H02M 1/32* (2013.01); *H02M 1/36* (2013.01); *H03F 1/526* (2013.01); *H03F 3/45179* (2013.01); *H03F 3/45183* (2013.01); *H03K 5/00* (2013.01); *H03F 2203/45288* (2013.01)

(58) Field of Classification Search
CPC ....................................................... G05F 1/57
See application file for complete search history.

(56) References Cited

U.S. PATENT DOCUMENTS

| | | | |
|---|---|---|---|
| 4,920,309 A | | 4/1990 | Szepesi |
| 5,235,540 A | * | 8/1993 | DeVeirman ........ H03H 11/0433 360/46 |
| 5,510,751 A | * | 4/1996 | Nauta ....................... H04B 3/02 330/260 |
| 7,091,785 B2 | | 8/2006 | Deval et al. |
| 7,187,233 B1 | | 3/2007 | Berry |
| 2002/0144166 A1 | | 10/2002 | Chang et al. |
| 2009/0224829 A1 | | 9/2009 | Johannsson |
| 2014/0035770 A1 | * | 2/2014 | Wulff ....................... H03M 3/39 341/143 |

OTHER PUBLICATIONS

International Search Report and Written Opinion, for PCT/US2016/053778, 8 pages.

* cited by examiner

*Primary Examiner* — Kyle J Moody
*Assistant Examiner* — Trinh Q Dang
(74) *Attorney, Agent, or Firm* — John R. Pessetto; Charles A. Brill; Frank D. Cimino (57) ABSTRACT

A fault tolerant voltage regulator may include a plurality of operational transconductance amplifiers. The plurality of operational transconductance amplifiers may be configured according to a unity-gain configuration. The plurality of operational transconductance amplifiers may be configured to couple in parallel to a load. The plurality of operational transconductance amplifiers may be configured to load share a load current associated with the load approximately equally among the plurality of operational transconductance amplifiers.

16 Claims, 3 Drawing Sheets

FIG. 6

FAULT TOLERANT VOLTAGE REGULATOR

CROSS-REFERENCE TO RELATED APPLICATIONS

The present application claims priority to U.S. Provisional Patent Application No. 62/233,136, filed Sep. 25, 2015, titled "Triple Redundant GM Driven LDO," which is hereby incorporated herein by reference in its entirety.

BACKGROUND

Some electrical circuits may have a single point of failure meaning that the circuit may fail entirely (e.g., cease to function in a desired or intended manner) when a single component or portion of the electrical circuit fails. Such failures may be caused, for example, by a current and/or voltage exceeding an operational range or threshold of the electrical circuit. One cause of an excessive current and/or voltage may be charged particles striking an electrical circuit. For example, an ionizing radiation particle strike may create electron-hole pairs in an electrical circuit that cause an excessive current to flow through the circuit (e.g., similar to coupling an unwanted current source into the circuit in parallel). Such a failure mode may cause the electrical circuit to fail and thus may be intolerable to other electrical circuits or devices utilizing the failed electrical circuit.

SUMMARY

In some embodiments, a plurality of operational transconductance amplifiers. The plurality of operational transconductance amplifiers may be configured according to a unity-gain configuration. The plurality of operational transconductance amplifiers may be configured to couple in parallel to a load. The plurality of operational transconductance amplifiers may be configured to load share a load current associated with the load approximately equally among the plurality of operational transconductance amplifiers.

In another implementation, a fault tolerant voltage regulator may include a first operational transconductance amplifier, a second operational transconductance amplifier coupled in parallel with the first operational transconductance amplifier, and a third operational transconductance amplifier coupled in parallel with the first operational transconductance amplifier and the second operational transconductance amplifier. Each of the first operational transconductance amplifier, the second operational transconductance amplifier, and the third operational transconductance amplifier may be configured to couple to a load. Each of the first operational transconductance amplifier, the second operational transconductance amplifier, and the third operational transconductance amplifier may include an input stage that may include a plurality of metal oxide semiconductor field effect transistors (MOSFETs). The plurality of MOSFETs may be configured to operate in accordance with a class B transfer function to approximately equally share a load current associated with the load.

In a further implementation, a method of sourcing or sinking a load current of a load. The method may include receiving a voltage from a power supply. The voltage may be based on a voltage provided by the power supply to the load. The method may also include transmitting a voltage based on the voltage received from the power supply to a plurality of amplifiers. The plurality of amplifiers may be configured as low-gain amplifiers and may operate in accordance with class B transfer function characteristics. The method may also include generating, by the plurality of amplifiers, an output current based on the voltage received from the power supply. Each of the plurality of amplifiers may contribute approximately equally to the output current. The method may also include generating, by a plurality of unaffected amplifiers, the output current based on the voltage received from the power supply when one of the plurality of amplifiers experiences an upset event. The plurality of unaffected amplifiers may be a subset of less than all of the plurality of amplifiers. Each of the plurality of unaffected amplifiers may contribute approximately equally to the output current.

BRIEF DESCRIPTION OF THE DRAWINGS

For a detailed description of various examples, reference will now be made to the accompanying drawings in which.

DETAILED DESCRIPTION

In some applications fault tolerance is beneficial so that the system can continue to operate normally in the face of a failure with a component of the system. Many electronic systems include a voltage regulator that generates regulated voltages for the various circuits comprising the system. Failure of the voltage regulator may render the entire system inoperative.

Disclosed herein are various embodiments directed to a fault tolerant voltage regulator. The disclosed fault tolerant voltage regulator may be a low dropout regulator (LDO) driven by a plurality of operational transconductance amplifiers configured to drive a load. In some embodiments, the load may be one or more resistors (or groups of resistors coupled together in series or parallel to create a desired resistance level). Each resistor may be used to terminate a respective double data rate (DDR) memory line coupled between processing and memory components of an electrical device. The disclosed fault tolerant voltage regulator may be redundant and, as such, may be able to continue operating in an expected manner when a portion of the fault tolerant voltage regulator fails. As used herein, an electrical component failing may be understood to mean the electrical component is temporarily unable to function in a normal and expected manner but after a period of time is able to recover from the failure to again function in the normal and expected manner, or a catastrophic failure in which the electrical component fails to function in the normal and expected manner and is unable to recover from the failure. For example, when the fault tolerant voltage regulator is struck by ionizing radiation (or more generally, affected by any upset event that causes a failure or unacceptably large deviation in an output voltage of the fault tolerant voltage regulator), a deviation in the output voltage of the fault tolerant voltage regulator may vary, for example, within an approximately 80 millivolt (mV) range approximately centered on an optimal output voltage of the fault tolerant voltage regulator (e.g., an approximately +/−40 mV tolerance of the optimal output voltage). In other embodiments, a deviation in the output voltage of the fault tolerant voltage regulator may vary within an approximately 50 mV range approximately centered on an optimal output voltage of the fault tolerant voltage regulator (e.g., an approximately +/−25 mV tolerance of the optimal output voltage).

Redundancy of the fault tolerant voltage regulator may be implemented, for example, by way of a plurality of operational transconductance amplifiers coupled in parallel. Each operational transconductance amplifier of the fault tolerant voltage regulator may be configured to provide a portion of the drive current for a load. For example, each operational transconductance amplifier may be configured to share support for the load with each other operational transconductance amplifier such that a current requirement of the load (e.g., sourcing or sinking current) may be split approximately evenly among each operational transconductance amplifier that is functioning properly in the fault tolerant voltage regulator. As a result, embodiments of the fault tolerant voltage regulator may provide increased reliability relative to conventional regulator circuits while providing equivalent or improved performance at a lesser degree of topological or circuit complexity relative to conventional redundant regulator circuits.

Figures 1, 2:
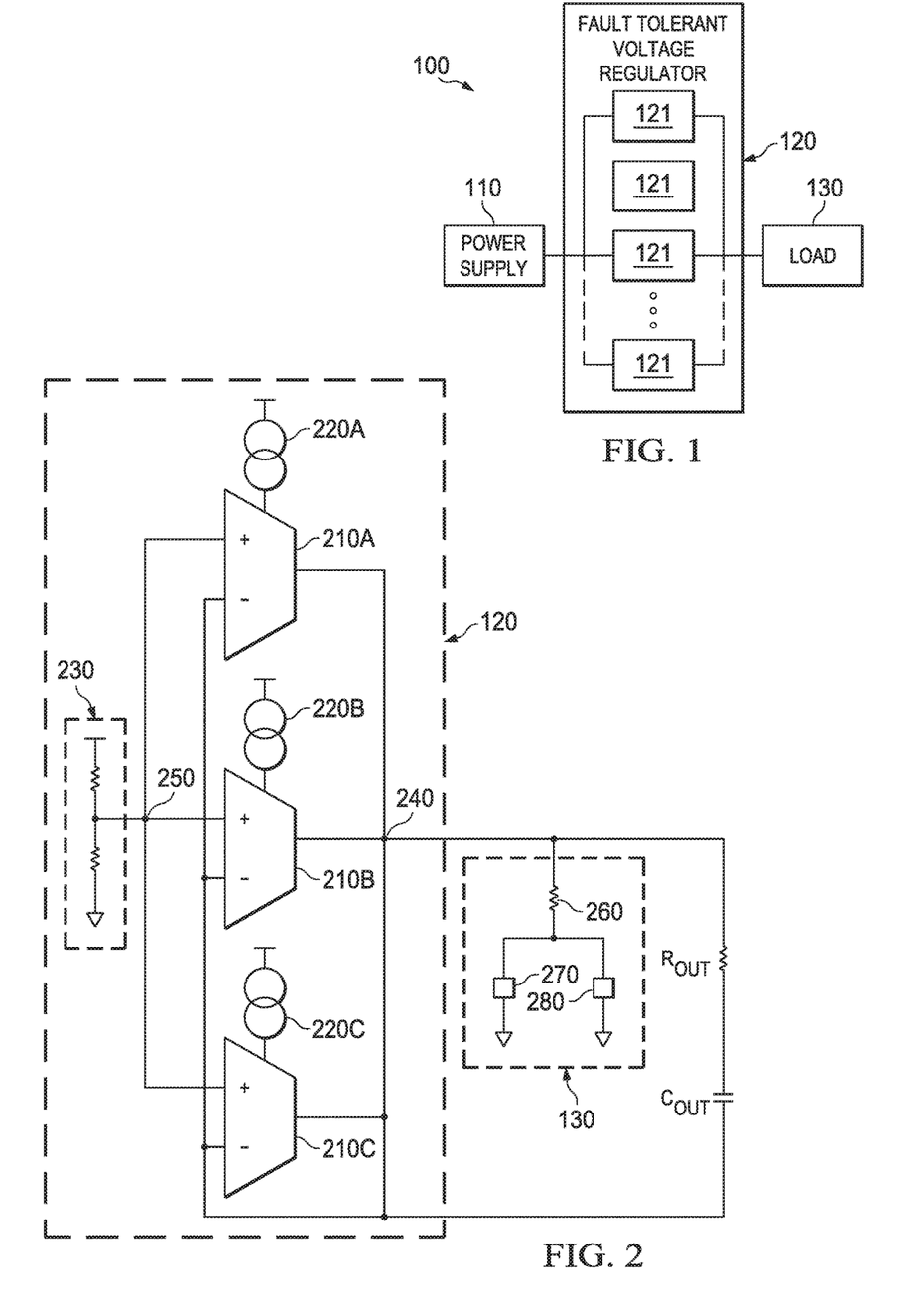
FIG. 1 shows a block diagram of an electronic device in accordance with various embodiments.
FIG. 2 shows a schematic diagram of the fault tolerant voltage regulator in accordance with various embodiments.

FIG. 1 shows a block diagram of an electronic device 100 in accordance with various embodiments. The electronic device 100 may include a power supply 110, a fault tolerant voltage regulator 120, and a load 130. The power supply 110 may be any suitable power supply included within, or coupled to, the electronic device 100. The power supply 110 may include, for example, any one or more electrical components (e.g., a transformer, an integrated circuit, or other suitable power supplying components) configured to output one or more direct current (DC) or alternating current (AC) voltages for use by the fault tolerant voltage regulator 120 or the load 130 for powering at least some components of the fault tolerant voltage regulator 120 or the load 130.

The load 130 may be any combination of electrical components or circuits that may be coupled to the fault tolerant voltage regulator 120 to be driven by the fault tolerant voltage regulator 120. For example, in some embodiments the load 130 may include one or more termination resistors coupled between the multiply redundant regulator 120 and a data line coupled between a processing circuit and a memory circuit such as a DDR circuit.

The fault tolerant voltage regulator 120 may comprise a plurality of regulator stages 121, each configured to couple to the load 130 to help drive the load 130. For example, each regulator stage 121 of the fault tolerant voltage regulator 120 may be configured to generate one or more regulated DC voltage outputs based on a voltage provided by the power supply 110 and source current to, or sink current from, the load 130. The fault tolerant voltage regulator 120 may have a number of regulator stages 121 corresponding to a desired level of redundancy determined of the fault tolerant voltage regulator 120. In some embodiments, the regulator stages 121 may be low (or approximately no) attenuation regulator stages (e.g., such as regulator stage configured according to a unity-gain configuration and/or configured without additional electrical components configured for gain or attenuation in a feedback path of the regulator stage). For example, the fault tolerant voltage regulator 120 may be a triple redundant fault tolerant voltage regulator having three regulator stages 121 such that when one regulator stage 121 of the fault tolerant voltage regulator 120 fails, the fault tolerant voltage regulator 120 may still operate to adequately drive the load using the remaining two regulator stages 121. As another example, the fault tolerant voltage regulator may be quadruple redundant having four regulator stages 121 such that when one or two regulator stages 121 of the fault tolerant voltage regulator 120 fail, the fault tolerant voltage regulator 120 may still continue operating to adequately drive the load 130. A greater level of fault tolerance provides the fault tolerant voltage regulator 120 with greater protection against failure than a regulator with a smaller level of fault tolerance. The above examples are non-limiting and the fault tolerant voltage regulator 120 may be configured, based on the teachings of the various embodiments disclosed herein, to include any number of regulator stages 121 to provide any desired level of redundancy, each implementation of which is intended to fall within the scope of the present disclosure. In some embodiments, each regulator stage 121 may comprise a plurality of transistors such as MOSFETs.

When one of the regulator stages 121 fails, the remaining regulator stages 121 may compensate for the failure and maintain adequate operation of the fault tolerant voltage regulator 120 to drive the load 130. For example, the fault tolerant voltage regulator 120 may include a plurality of independently biased operational transconductance amplifiers, each configured to source or sink an approximately equal portion of load current associated with the load 130. The operational transconductance amplifiers of the fault tolerant voltage regulator 120 may be configured to share the approximately equal portion of support for sourcing or sinking the load current associated with the load 130 when all operational transconductance amplifiers of the fault tolerant voltage regulator 120 are functioning properly as well as when less than all operational transconductance amplifiers of the fault tolerant voltage regulator 120 are functioning properly.

FIG. 2 shows a schematic diagram of the fault tolerant voltage regulator 120 in accordance with various embodiments. The fault tolerant voltage regulator 120 may include a plurality of operational transconductance amplifiers 210A, 210B, and 210C. Although three amplifiers are shown in the embodiment of FIG. 2, the fault tolerant voltage regulator 120 may include any number of operational transconductance amplifiers 210 in other embodiments to provide a desired level of redundancy. Each operational transconductance amplifier 210A, 210B, and 210C may be individually biased by a respective current source 220A, 220B, and 220C. Because each of the operational transconductance amplifiers 210A, 210B, and 210C is biased by a separate current source 220A, 220B, and 220C, none of the current sources 220A, 220B, or 220C is a potential point of failure for more than one operational transconductance amplifier 210A, 210B, or 210C. Each of the current sources 220A, 220B, and 220C may generate a bias current proportional (or approximately proportional) to a temperature, such as an environmental temperature in which the electronic device 100 is configured to operate.

Based on an intended application of the fault tolerant voltage regulator 120, the fault tolerant voltage regulator 120 may further include additional components such as a voltage divider 230 which may be configured to manipulate a voltage received by the fault tolerant voltage regulator 120 from the power supply 110 before the voltage is received by the operational transconductance amplifiers 210A, 210B, and 210C. For example, when the fault tolerant voltage regulator 120 is utilized as a driver for a termination resistor 260 that terminates DDR communication lines between processing circuitry 270 and memory circuitry 280, the voltage divider 230 may divide the voltage received by the fault tolerant voltage regulator 120 from the power supply 110 (e.g., a voltage approximately equal to a voltage provided to the memory circuitry) before the voltage is received by the operational transconductance amplifiers 210A, 210B, and 210C. For example, the voltage divider 230 may divide the voltage received by the fault tolerant voltage regulator 120 from the power supply 110 by a factor of two (e.g., the voltage divider 230 may be an "R by R" voltage divider in which each resistor of the voltage divider 230 has an approximately equal magnitude of resistance and thus the power supply voltage is divided in half). Additionally, the fault tolerant voltage regulator 120 may further include, or be configured to couple to, additional components such as an output resistor $R_{out}$ and an output capacitor $C_{out}$, as shown. For example, the fault tolerant voltage regulator 120 may be configured to couple to the output capacitor $C_{out}$ to select or program certain characteristics (e.g., a frequency response and/or a bandwidth) of the fault tolerant voltage regulator 120. In such embodiments, the output resistor $R_{out}$ may be an inherent resistance of the output capacitor $C_{out}$ rather than a separate electrical component. In other embodiments, the output resistor $R_{out}$ may be a separate electrical component that may be included in addition to the inherent resistance of the output capacitor $C_{out}$.

Each operational transconductance amplifier 210A, 210B, and 210C may include a positive differential input and a negative differential input, as well as an output. In some embodiments, the positive differential input may be referred to as a non-inverting input of a differential input pair and the negative differential input may be referred to as an inverting input of the differential input pair. The output of each operational transconductance amplifier 210A, 210B, and 210C may be coupled to a common output node 240 that may also be coupled to the load 130 and the output resistor $R_{out}$. The negative differential input of each operational transconductance amplifier 210A, 210B, and 210C may be coupled to the common output node 240 as shown. As such, each operational transconductance amplifier 210A, 210B, and 210C may be configured according to a unity gain configuration in which components are not placed in a feedback loop of the operational transconductance amplifiers 210A, 210B, or 210C to provide an attenuation or gain to an output of any of the operational transconductance amplifiers 210A, 210B, or 210C. Alternatively, in other embodiments, one or more of the operational transconductance amplifiers 210A, 210B, and 210C may include one or more electrical components in a feedback loop to provide a desired gain or scaling factor for an output of the respective operational transconductance amplifiers 210A, 210B, or 210C. The positive differential input of each operational transconductance amplifier 210A, 210B, and 210C may be coupled to a common input node 250 that is coupled to an output of the voltage divider 230 (or alternatively, a power or signal supply with the voltage divider 230 is not included in the fault tolerant voltage regulator 120).

Each operational transconductance amplifier 210A, 210B, and 210C may be configured to load share a load current associated with the load 130 approximately equally between the amplifiers. For example, for a load 130 that sources or sinks a current of 3 amps, each operational transconductance amplifier 210A, 210B, and 210C may be configured to source or sink 1 amp of the load current. To provide redundancy, each operational transconductance amplifier 210A, 210B, and 210C may be configured such that a maximum sourceable or sinkable current (e.g., a current limit) of each operational transconductance amplifier 210A, 210B, and 210C is approximately one half of a maximum load current associated with the load 130. For example, for the load 130 that sources or sinks a current of 3 amps, each operational transconductance amplifier 210A, 210B, and 210C may be capable of servicing (e.g., sourcing or sinking) 1.5 amps of the load current. In this way, fewer than all of the operational transconductance amplifiers 210A, 210B, and 210C (e.g., only two of the operational transconductance amplifiers 210A, 210B, or 210C) may be capable of servicing the load current if an output current of a third of the operational transconductance amplifiers 210A, 210B, or 210C is unable to load share the load current. For example, in an embodiment in which one of the operational transconductance amplifiers (e.g., operational transconductance amplifier 210A for the sake of discussion) experiences an upset event (e.g., a failure or shutdown) that renders the operational transconductance amplifier 210A unable to load share the load current, the remaining two operational transconductance amplifiers 210B and 210C may compensate for the lack of output from the operational transconductance amplifier 210A. The operational transconductance amplifiers 210B and 210C may compensate for the lack of output by load sharing between only the operational transconductance amplifiers 210B and 210C the load current that was previously load shared among operational transconductance amplifiers 210A, 210B, and 210C. Such compensation may result in a greater amount of the load current being serviced by each of the operational transconductance amplifiers 210B and 210C than prior to the upset event affecting the operational transconductance amplifier 210A.

In another embodiment in which the operational transconductance amplifier 210A experiences the upset event, the upset event may not render the operational transconductance amplifier 210A unable to load share the load current. Instead, the upset event may contribute additional current to the output current of the operational transconductance amplifier 210A. The additional current may be a transient current that may dissipate over a period of time. However, a magnitude of the additional current may be subject to certain compliance specifications (e.g., Joint Electron Device Engineering Council (JEDEC) specifications) that limit an output current or voltage range of the fault tolerant voltage regulator 120. Because each operational transconductance amplifier 210A, 210B, and 210C is configured to load share the load current approximately equally, each operational transconductance amplifier 210A, 210B, and 210C is responsible for and contributes only approximately one-third of an output current of the fault tolerant voltage regulator 120. As such, the additional current resulting in the output current of the operational transconductance amplifier 210A as a result of the upset event may have approximately one-third of an effect on an output of the fault tolerant voltage regulator 120 than an effect on an output of conventional regulator implementations suffering from a similar upset event. As a result, in some embodiments the fault tolerant voltage regulator 120 may be capable of experiencing an upset event of an approximately three times greater magnitude than conventional regulator implementations while maintaining an output current or voltage that complies with applicable specifications.

Each of the operational transconductance amplifiers 210A, 210B, and 210C may have an approximately equal transconductance value. For example, the transconductance value of each of the operational transconductance amplifiers 210A, 210B, and 210C may be determined according to $g_m = I_{out}/\Delta V$, where $g_m$ is the transconductance value of the operational transconductance amplifiers 210A, 210B, and 210C, $I_{out}$ is 1/x of the load current with x being the number of operational transconductance amplifiers having outputs coupled to the common output node 240 (e.g., illustrated as three in FIG. 2), and $\Delta V$ is a difference between voltages present at the positive differential input and the negative differential input of each of the operational transconductance amplifiers 210A, 210B, and 210C (e.g., a difference between a voltage present at the common input node 250 and a voltage present at the common output node 240). In some embodiments, the transconductance value of each of the operational transconductance amplifiers 210A, 210B, and 210C may be determined based on a desired $\Delta V$ of approximately 40 mV, approximately 25 mV, or another suitable voltage. In some embodiments, the transconductance value of each of the operational transconductance amplifiers may be determined according to a minimum number of operational transconductance amplifiers that may support a load current of the load 130 instead of a total number of operational transconductance amplifiers having outputs coupled to the common output node 240. Alternatively, the transconductance value may be determined according to any suitable means based on a particular topology, implementation, or configuration of the fault tolerant voltage regulator 120.

Figures 3, 4:
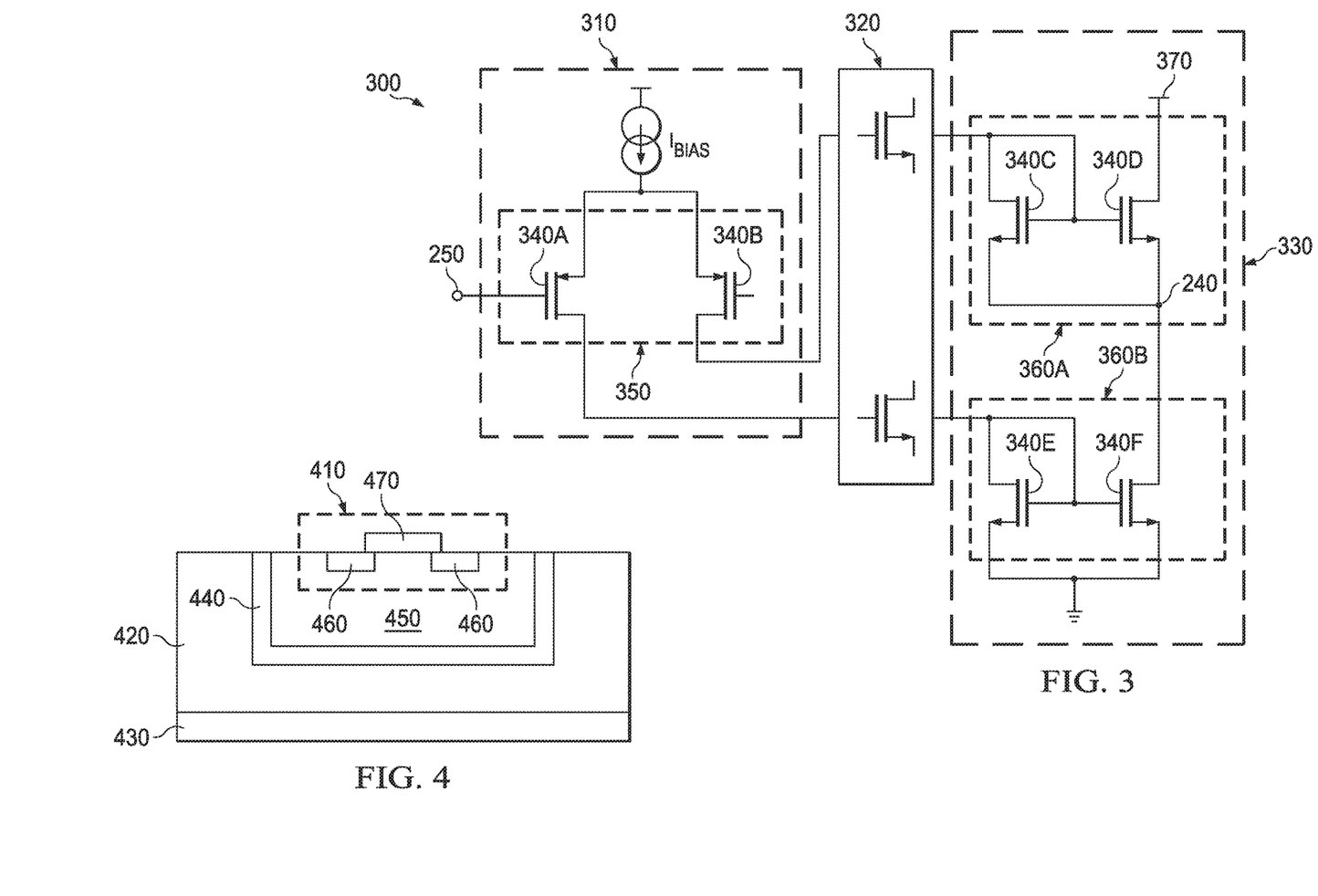
FIG. 3 shows a block diagram of an operational transconductance amplifier in accordance with various embodiments.
FIG. 4 shows a schematic diagram of a physical implementation of a transistor of the fault tolerant voltage regulator in accordance with various embodiments.

FIG. 3 shows an illustrative block diagram of an operational transconductance amplifier 300, such as may be as any one or more of the operational transconductance amplifiers 210A, 210B, or 210C. In the example of FIG. 3, the amplifier 300 may include an input stage 310, a class B function stage 320, and an output stage 330. The input stage 310 may comprise a plurality of transistors (e.g., transistors 340A and 340B) that may be configured as a differential input pair 350 that may be configured to receive a differential input. For example, a positive differential input of the differential input pair 350 (e.g., an input or gate terminal of the transistor 340A) may be coupled to the node 250 and a negative differential input of the differential input pair 350 (e.g., an input or gate terminal of the transistor 340B) may be coupled to the node 240, both as discussed above. It should be understood that while the input stage 310 is illustrated as having transistors 340A and 340B, the input stage 310 may in fact include any number of transistors suitable for use in the amplifier 300. The transistors 340A and 340B may be, in some embodiments, p-type MOSFETs that may be coupled to a bias current $I_{bias}$ (e.g., such as one of the bias currents 220A, 220B, or 220C, as discussed above). Based on the input received by the differential input pair 350, the differential input stage 310 may be configured to transmit a current of approximately $$\frac{I_{bias}}{2} \pm \frac{\Delta Id}{2}$$

to the class B transfer function stage 320, where $$\Delta Id = \frac{k_p * W}{L} * V_{id} * \sqrt{\frac{4 * I_{bias} * L}{k_p * L} - V_{id}^2},$$

$k_p$ is a transconductance gain of the transistors 340A and 340B, W is a width of the transistors 340A and 340B, L is a length of the transistors 340A and 340B, $I_{bias}$ is a magnitude of the bias current, and $V_{id}$ is a different between the positive differential input and the negative differential input of the differential input pair 350.

The class B transfer function stage 320 may include a plurality of transistors (e.g., n-type or p-type MOSFETs) that may be configured to generate a signal characteristic of a class B transfer function, as discussed below. For example, the class B transfer function stage 320 may include a first plurality of transistors that may be configured to cause the amplifier 300 to source current to a load when $V_{id}$ is greater than a first threshold and a second plurality of transistors that may be configured to cause the amplifier 300 to sink current from the load when $-V_{id}$ is less than a second threshold (e.g., the first and second thresholds being determined with respect to a nominal output voltage of the amplifier 300). It should be understood that the transistors of the class B transfer function stage 320 may be implemented in any configuration that may be suitable for causing the amplifier 300 to source current to, or sink current from, the load based on an output of the input stage 310.

The output stage 330 may include a plurality of transistors configured as one or more current mirrors and may be coupled to an input power supply 370. For example, the output stage 330 may include transistors 340C and 340D that may be configured to form a current mirror 360A, and transistors 340E and 340F that may be configured to form a current mirror 360B. The current mirrors 360A and 360B may be configured to scale a current received by the output stage 330 from the class B transfer function stage 320 into an output current that is greater than the received current. It should be understood that while the output stage 330 is illustrated as having current mirrors 360A and 360B, the output stage 330 may in fact include any number of current mirrors or other transistors suitable for use in sourcing or sinking current by the amplifier 300. Additionally, it should be noted that each of the transistors 340A, 340B, 340C, 340D, 340E, and 340F may be individually implemented according to any suitable semiconductor technology, topology, or doping characteristic and may include additional electrical components and/or may be arranged in any suitable configuration to support such implementation.

FIG. 4 shows a schematic diagram of a physical implementation of a transistor 410 of the fault tolerant voltage regulator 120 in accordance with various embodiments. The fault tolerant voltage regulator 120 may be implemented, in some embodiments, as an integrated circuit constructed on a semiconductor. For example, one or more transistors of the fault tolerant voltage regulator 120 (e.g., such as one or more of the transistors that comprise the input stage and/or the output stage of the operational transconductance amplifiers 210A, 210B, or 210C) may be implemented by a variety of semiconductor regions, some of which may be doped (e.g., made impure through an introduction of impurities to effect electrical properties of the semiconductor). As illustrated in FIG. 4, the transistor 410 may be implemented, in some embodiments, by forming an epitaxial layer 420 on a substrate 430 and doping the epitaxial layer according to a desired semiconductor configuration (e.g., by doping the regions 460 to form n-doped regions and doping the region 470 to form a p-doped region). For example, the epitaxial layer may be doped in one or more areas with one or more concentrations of impurities that may cause an abundance of electrons or an abundance of holes, the combination and/or orientation of which may determine the electrical characteristics of the semiconductor. The transistor 410 may be isolated by an isolation region 440 such that the transistor 410 exists within an isolated well 450 of the semiconductor. In some embodiments, the isolation region 440 may be heavily doped with a first dopant (e.g., such that the isolation region is deeply n-doped) and both the epitaxial layer and the isolated well 450 may be doped with a second dopant (e.g., such that the epitaxial layer and the isolated well 450 may be p-doped). In this way, when an undesirable charge or current is introduced to the isolated well 450, for example, as a result of an ionizing radiation particle strike, the undesirable charge or current introduced to the transistor 410 and/or the isolated well 450 may be limited to the isolated well 450 by way of the isolation region 440. Such an isolation of the undesirable charge or current may inhibit charge sharing between the transistor 410 and/or the isolated well 450 and other transistors or electrical structures or components that may be formed on, or otherwise coupled to, the substrate 430 or the epitaxial layer 420.

Figure 5:
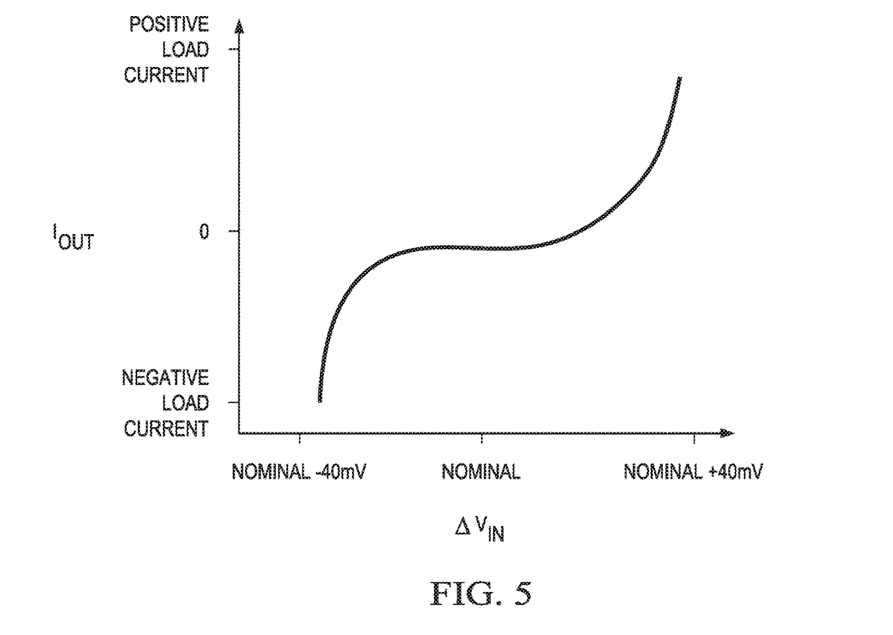
FIG. 5 shows a graph of a class B transfer function in accordance with various embodiments.

FIG. 5 shows an example of a graph 500 of a class B transfer function in accordance with various embodiments. The class B transfer function illustrated in graph 400 may illustrate minimum requirements for a fault tolerant voltage regulator 120 that is configured to operate within an approximately +/−40 mV tolerance of an optimal output voltage. The x-axis represents the differential input voltage of the fault tolerant voltage regulator 120 and the y-axis represents the output current of the fault tolerant voltage regulator 120. Electrical components that share a common design and/or are fabricated in a common production run may nonetheless vary with regard to any one or more electrical characteristics. Such a variation may cause an undesirable complexity or difficulty in creating fault tolerant regulator circuits according to conventional. The fault tolerant voltage regulator 120 may be configured to compensate for such variations to reduce an effect of the variations on performance of the fault tolerant voltage regulator 120. In some embodiments, such a compensation may be performed by configuring components of the fault tolerant voltage regulator 120 (e.g., transistors coupled together to form the operational transconductance amplifiers 210A, 210B, and 210C) to operate in accordance with certain desired electrical characteristics. For example, a transfer function may describe a relationship between an input voltage and an output current of an electrical component. Certain transfer functions may be characteristic of certain electrical component responses. For example, a class A transfer function may describe an approximately linear or x:y relationship between an input voltage and an output current of an electrical component, where for approximately x volts in input voltage, approximately y amps of output current are generated. As another example, a class B transfer function may describe a relationship between an input voltage and an output current in terms of a polynomial function wherein the output may not be linearly proportional to the input voltage across an operational range of the electrical component. For example, the electrical component may be configured to operate in accordance with a class B transfer function that includes a transition zone where minimal to no change in output current may occur in response to a change in input voltage.

Electrical components of the fault tolerant voltage regulator 120 may be configured to advantageously utilize a particular embodiment of a class B transfer function to compensate for the inherent variations among electrical components, as discussed above. For example, without such compensations, a first of the operational transconductance amplifiers 210A, 210B, or 210C may output x current for z differential input voltage while a second of the operational transconductance amplifiers 210A, 210B, or 210C may output y current for the same z differential input voltage, where x and y are current magnitudes that are not equal and z is the differential input voltage. Such variations may inhibit approximately equal load sharing of the operational transconductance amplifiers 210A, 210B, and 210C. By configuring the electrical components of the fault tolerant voltage regulator 120 to advantageously utilize a particular embodiment of a class B transfer function, the fault tolerant voltage regulator may utilize the transition zone of the class B transfer function to compensate for variations among the electrical components. For example, by utilizing the transition zone of the class B transfer function, a system-wide "on" and "off" may be configured such that the electrical components may each respond to an approximately equal input voltage with an approximately equal output current. For example, in some embodiments, operating in accordance with the class B transfer function of graph 500 may enable the operational transconductance amplifiers 210A, 210B, and 210C to compensate for an offset between the positive differential input and the negative differential input of each of the operational transconductance amplifiers 210A, 210B, and 210C to enable the operational transconductance amplifiers 210A, 210B, and 210C to each service an approximately equal portion of the load current, as discussed above.

As shown in graph 500, when the fault tolerant voltage regulator 120 sinks current from the load 130, for example, as illustrated by a current between zero and negative load current, current may flow from the load 130 to the fault tolerant voltage regulator 120. When the multiple redundant regulator 120 sources current to the load 130, for example, as illustrated by a current between zero and positive load current, current may flow from the fault tolerant voltage regulator 120 to the load 130.

Figure 6:
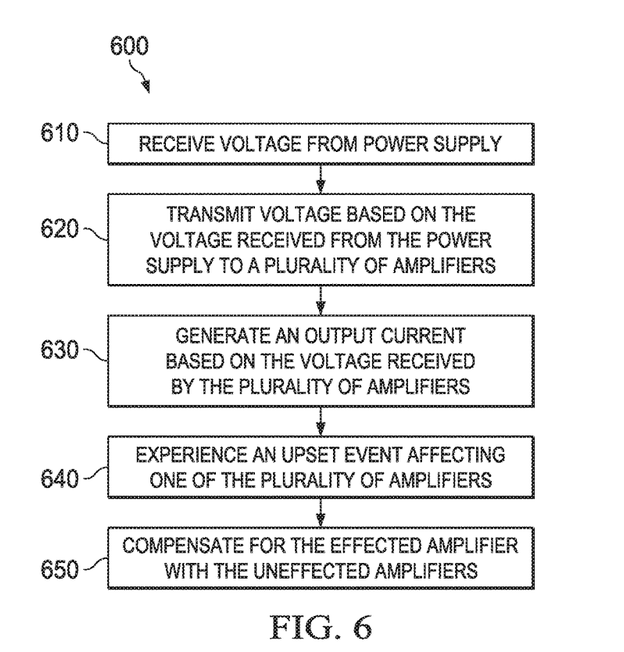
FIG. 6 shows a flowchart of a method for servicing a load current of a load in accordance with various embodiments.

FIG. 6 shows a flowchart of a method 600 for servicing (e.g., sourcing or sinking) a load current of a load in accordance with various embodiments. The method 600 may be implemented in a regulator of an electronic device, for example, by the fault tolerant voltage regulator 120. The method 600 may be implemented to, for example, service a load current via a plurality of parallel-coupled amplifiers (such as, for example, operational transconductance amplifiers) performing load sharing before and after an upset event inhibits an ability of one of the amplifiers to participate in the load sharing. The load may include, for example, one or more DDR memory communication line terminations resistors.

At step 610, the regulator receives a voltage from a power supply (e.g., the power supply 110). The voltage received from the power supply may be, in some embodiments, based on a voltage provided by the power supply to another circuit (e.g., the load 130), or may be a unique or independent voltage not provided by the power supply to another circuit. Upon receipt of the voltage from the power supply, the regulator may scale the voltage, or may utilize the voltage without scaling. For example, in some embodiments the regulator may scale the voltage received from the power supply (e.g., to a scaled voltage approximately one-half of the voltage received from the power supply) through the use of a voltage divider.

At step 620, a voltage based on the voltage received from the power supply (e.g., the voltage received from the power supply or the scaled voltage) may be transmitted to a plurality of amplifiers (e.g., the operational transconductance amplifiers 210A, 210B, or 210C) to cause the amplifiers to output a current based on the scaled voltage. The amplifiers may be low-gain amplifiers (e.g., configured according to a unity gain configuration) and may be configured to operate in accordance with class B transfer function characteristics, as discussed above. The amplifiers may further receive a second voltage (e.g., a feedback voltage such that the scaled voltage and the feedback voltage for a differential input voltage comprise a differential input voltage that may be received by each respective amplifier at differential input ports) from, for example, an output of each respective amplifier. A coupling between the output an input of each respective amplifier may comprise a feedback path or feedback loop.

At step 630, the amplifiers generate an output current based on the voltage received from the power supply and, optionally, the second voltage. The output current may be determined, for example, according to a desired load current of a load to which the regulator may be coupled. The amplifiers may load share the load current such that each of the amplifiers provides an approximately equal portion of the output current of the regulator. For example, when the regulator includes three amplifiers, each amplifier may provide approximately one-third of the output current when the regulator is operating normally. As another example, when the regulator includes four amplifiers, each amplifier may provide approximately one-fourth of the output current when the regulator is operating normally.

At step 640, one of the amplifiers of the regulator experiences an upset event that alters or affects an output of the effected amplifier. The upset event may be, for example, an ionizing radiation particle strike that alters operation of the effected amplifier. The upset event may, for example, introduce an additional amount of current into an output of the effected amplifier (e.g., as may be represented or understood as an additional current source coupled across the output of the effected amplifier). In some embodiments, the additional amount of current may dissipate over a period of time and have limited to no effect on normal operations of the regulator. In other embodiments, the upset event and/or the additional amount of current may render the effected amplifier inoperable or inhibit the effected amplifier from outputting sufficient current to approximately equally participate in load sharing with a remainder of the amplifiers that may be unaffected by the upset event.

At step 650, when the effected amplifier is inoperable or otherwise unable to output sufficient current to approximately equally participate in load sharing, the unaffected amplifiers (e.g., a subset of all amplifiers in the regulator that is fewer in number than a total number of amplifiers in the regulator) may compensate for the effected amplifier by performing load sharing between the unaffected amplifiers. When the unaffected amplifiers compensate for the loss of the effected amplifiers, the unaffected amplifiers may output a greater amount of current to contribute to the output of the regulator that the unaffected amplifiers output prior to the upset event occurring at step 540.

It should be understood that while the above steps of method 600 have been discussed in the context of generating an output current for servicing a load (e.g., sourcing current), the disclosed techniques may be equally adaptable to sinking current from the load, and embodiments of both usage scenarios are within the scope of the present disclosure.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. Unless otherwise stated, "approximately" means +/−10 percent of the stated value.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A fault tolerant voltage regulator comprising:
  a plurality of operational transconductance amplifiers configured according to a unity-gain configuration and to couple in parallel to a load, wherein the plurality of operational transconductance amplifiers are configured to load share a load current associated with the load approximately equally among the plurality of operational transconductance amplifiers;
  wherein an output of each of the plurality of the operational transconductance amplifiers is coupled to a common output node, and wherein a negative input of each of the operational transconductance amplifiers is coupled to the common output node;
  wherein the load comprises a termination resistor coupled between the output node and a communication line coupled between a processing circuit and a memory circuit.

2. A fault tolerant voltage regulator comprising:
  a plurality of operational transconductance amplifiers configured according to a unity-gain configuration and to couple in parallel to a load, wherein the plurality of operational transconductance amplifiers are configured to load share a load current associated with the load approximately equally among the plurality of operational transconductance amplifiers;
  wherein each of the plurality of operational transconductance amplifiers is further configured to generate an output characteristic of a class B transfer function.

3. A fault tolerant voltage regulator comprising:
  a plurality of operational transconductance amplifiers configured according to a unity-gain configuration and to couple in parallel to a load, wherein the plurality of operational transconductance amplifiers are configured to load share a load current associated with the load approximately equally among the plurality of operational transconductance amplifiers;
  wherein a first of the plurality of operational transconductance amplifiers is coupled to a first current source configured to bias the first of the plurality of operational transconductance amplifiers, and wherein the first current source is independent of a second current source coupled to a second of the plurality of operational transconductance amplifiers and configured to bias the second of the plurality of operational transconductance amplifiers.

4. A fault tolerant voltage regulator comprising:
  a first operational transconductance amplifier;
  a second operational transconductance amplifier coupled in parallel with the first operational transconductance amplifier; and a third operational transconductance amplifier coupled in parallel with the first operational transconductance amplifier and the second operational transconductance amplifier, wherein each of the first operational transconductance amplifier, the second operational transconductance amplifier, and the third operational transconductance amplifier is configured to couple to a load and comprises an input stage that comprises a plurality of metal oxide semiconductor field effect transistors (MOSFETs), and wherein the plurality of MOSFETs are configured to operate in accordance with a class B transfer function to approximately equally share a load current associated with the load.

5. The fault tolerant voltage regulator of claim 4, wherein the second operational transconductance amplifier and the third operational transconductance amplifier are configured to load share the load current of the load approximately equally when the first operational transconductance amplifier fails.

6. The fault tolerant voltage regulator of claim 4, wherein the load is a double data rate (DDR) termination resistor.

7. The fault tolerant voltage regulator of claim 4, wherein a transconductance value of each of the first operational transconductance amplifier, the second operational transconductance amplifier, and the third operational transconductance amplifier is approximately equally.

8. The fault tolerant voltage regulator of claim 4, wherein each of the first operational transconductance amplifier, the second operational transconductance amplifier, and the third operational transconductance amplifier is independently biased by a bias current.

9. The fault tolerant voltage regulator of claim 4, wherein each of the first operational transconductance amplifier, the second operational transconductance amplifier, and the third operational transconductance amplifier is configured according to a unity gain configuration.

10. The fault tolerant voltage regulator of claim 4, wherein an output voltage of the fault tolerant voltage regulator is within an approximately 80 millivolt (mV) range that is approximately centered on an optimal output of the fault tolerant voltage regulator.

11. The fault tolerant voltage regulator of claim 10, wherein the output voltage of the fault tolerant voltage regulator is within an approximately 50 mV range that is approximately centered on the optimal output of the fault tolerant voltage regulator.

12. A method of sourcing or sinking a load current of a load, comprising:
receiving a voltage from a power supply, the voltage based on a voltage provided by the power supply to the load;
transmitting a voltage based on the voltage received from the power supply to a plurality of amplifiers, the plurality of amplifiers configured as low-gain amplifiers operating in accordance with class B transfer function characteristics;
generating, by the plurality of amplifiers, an output current based on the voltage received from the power supply, wherein each of the plurality of amplifiers contributes approximately equally to the output current; and
generating, by a plurality of unaffected amplifiers, the output current based on the voltage received from the power supply when one of the plurality of amplifiers experiences an upset event, wherein the plurality of unaffected amplifiers is a subset of less than all of the plurality of amplifiers, and wherein each of the plurality of unaffected amplifiers contributes approximately equally to the output current.

13. The method of claim 12, wherein the upset event is an ionizing radiation particle strike that renders the one of the plurality of amplifiers that experiences the upset event incapable of contributing approximately equally to the output current.

14. The method of claim 12, wherein a contribution to the output current of each of the unaffected amplifiers is greater after the upset event that a contribution to the output current of each of the unaffected amplifiers prior to the upset event.

15. The method of claim 12, wherein the voltage based on the voltage received from the power supply is an output of a voltage divider that scales the voltage received from the power supply.

16. The method of claim 12, wherein the load is a double data rate (DDR) memory communication line termination resistor.

* * * * *